(12) United States Patent
Zhang et al.

(10) Patent No.: US 10,879,278 B2
(45) Date of Patent: Dec. 29, 2020

(54) DISPLAY SUBSTRATE, MANUFACTURING METHOD THEREFOR, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Jiaxiang Zhang, Beijing (CN); Fengtao Wang, Beijing (CN); Yanqiang Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 88 days.

(21) Appl. No.: 16/092,380

(22) PCT Filed: Mar. 5, 2018

(86) PCT No.: PCT/CN2018/078029
§ 371 (c)(1),
(2) Date: Oct. 9, 2018

(87) PCT Pub. No.: WO2018/161874
PCT Pub. Date: Sep. 13, 2018

(65) Prior Publication Data
US 2019/0115371 A1 Apr. 18, 2019

(30) Foreign Application Priority Data
Mar. 9, 2017 (CN) .......................... 2017 1 0137831

(51) Int. Cl.
*H01L 27/12* (2006.01)
*H01L 21/465* (2006.01)

(52) U.S. Cl.
CPC .......... *H01L 27/127* (2013.01); *H01L 21/465* (2013.01); *H01L 27/124* (2013.01);
(Continued)

(58) Field of Classification Search
CPC . H01L 27/127; H01L 21/465; H01L 27/1259; H01L 27/124; H01L 27/1288; H01L 27/1222
See application file for complete search history.

(56) References Cited

U.S. PATENT DOCUMENTS 5,990,987 A * 11/1999 Tanaka .............. G02F 1/134363
349/43
8,227,283 B2 * 7/2012 Seong ..................... H01L 33/42
257/E33.074
(Continued)

FOREIGN PATENT DOCUMENTS

CN 103488004 A 1/2014
CN 103988288 A 8/2014
(Continued)

OTHER PUBLICATIONS

International Search Report of PCT/CN2018/078029 in Chinese, dated Jun. 11, 2018, with English translation.
(Continued)

*Primary Examiner* — Sue A Purvis
*Assistant Examiner* — Vicki B. Booker
(74) *Attorney, Agent, or Firm* — Collard & Roe, P.C.

(57) ABSTRACT

A display substrate, a manufacturing method thereof, and a display device are provided. The manufacturing method of the display substrate includes: forming a pattern of first transparent conductive layer, forming a passivation layer and forming a second transparent conductive layer on the passivation layer, forming a pattern of second transparent conductive layer, i.e., a slit electrode, the pattern of second transparent conductive layer including a plurality of sub-electrodes arranged at intervals and located in a display region of the display substrate; and removing a portion of the passivation layer which is in the display region and is not
(Continued)

covered by the sub-electrodes, forming a pattern of passivation layer. The second transparent conductive layer is polycrystalline ITO.

6 Claims, 3 Drawing Sheets

(52) U.S. Cl.
CPC ...... *H01L 27/1222* (2013.01); *H01L 27/1259* (2013.01); *H01L 27/1288* (2013.01)

(56) References Cited

U.S. PATENT DOCUMENTS

| | | |
|---|---|---|
| 2014/0247411 A1 | 9/2014 | Kim et al. |
| 2014/0346502 A1 | 11/2014 | Matsukizono |
| 2016/0148954 A1* | 5/2016 | Sun .................... H01L 27/1288 257/72 |
| 2016/0266454 A1 | 9/2016 | Wang |

FOREIGN PATENT DOCUMENTS

| | | |
|---|---|---|
| CN | 104035228 A | 9/2014 |
| CN | 104155814 A | 11/2014 |
| CN | 106847757 A | 6/2017 |
| JP | 2011023444 A | 2/2011 |
| KR | 20020076938 A | 10/2002 |

OTHER PUBLICATIONS

Notice of Transmittal of the International Search Report of PCT/CN2018/078029 in Chinese, dated Jun. 11, 2018.

Written Opinion of the International Searching Authority of PCT/CN2018/078029 in Chinese, dated Jun. 11, 2018 with English translation.

* cited by examiner

DISPLAY SUBSTRATE, MANUFACTURING METHOD THEREFOR, AND DISPLAY DEVICE

CROSS REFERENCE TO RELATED APPLICATIONS

This application is the National Stage of PCT/CN2018/078029 filed on Mar. 5, 2018, which claims priority under 35 U.S.C. § 119 of Chinese Application No. 201710137831.7 filed on Mar. 9, 2017, the disclosure of which is incorporated by reference.

TECHNICAL FIELD

Embodiments of the present disclosure relate to a display substrate, a manufacturing method thereof, and a display device.

BACKGROUND

In the existing display products using advanced super-dimensional field switching (ADS) technology, two indium tin oxide (ITO) layers, that is, a first ITO layer and a second ITO layer, are formed on an array substrate. The first ITO layer is used as a pixel electrode and is a planar electrode. The second ITO layer is served as a common electrode and is a slit electrode. In a film forming process of the second ITO layer, polycrystalline ITO is generated, and the polycrystalline ITO is difficult to be removed by etching. Therefore, after patterning the second ITO layer, polycrystalline ITO particles are left in intervals of the slit electrode, which will not only cause Mura (brightness unevenness) and other defects due to a disorder of driving electric field in the display product, but also affect a transmittance of the display product.

SUMMARY

In order to solve the above technical problems, at least one embodiment of the present disclosure provides a display substrate, a manufacturing method thereof, and a display device, which can remove residual polycrystalline ITO particles existed in the intervals of the slit electrode, improve display performance of the display device, and increase transmittance of the display device.

In order to achieve the above technical effects, embodiments of the present disclosure adopt the following technical solutions.

On one aspect, a manufacturing method of a display substrate is provided, the method includes: forming an insulation layer and forming a pattern of second transparent conductive layer on the insulation layer, the pattern of second transparent conductive layer including a plurality of sub-electrodes arranged at intervals, the plurality of sub-electrodes being located in a display region of the display substrate; and removing a portion of the insulation layer which is in the display region and is not covered by the plurality of sub-electrodes, forming a pattern of insulation layer.

In an example, forming the pattern of second transparent conductive layer and forming the pattern of insulation layer includes:
forming a transition pattern of transparent conductive layer on the insulation layer, the transition pattern of transparent conductive layer including a first portion located in a thin film transistor (TFT) region of the display substrate and a second portion located in the display region, the second portion including the plurality of sub-electrodes arranged at intervals;
removing a portion of the insulation layer corresponding to an interval between adjacent sub-electrodes in the display region; and
removing the first portion of the transition pattern of transparent conductive layer, forming the pattern of second transparent conductive layer.

In an example, forming the pattern of second transparent conductive layer and forming the pattern of insulation layer further includes
depositing a second transparent conductive layer on the insulation layer;
coating a photoresist on the second transparent conductive layer, exposing and developing the photoresist to form a photoresist retained region and a photoresist removed region, the photoresist removed region corresponding to the interval between adjacent sub-electrodes;
removing a portion of the second transparent conductive layer in the photoresist removed region by a wet etching process to form the transition pattern of transparent conductive layer;
removing a portion of the insulation layer in the photoresist removed region by a dry etching process;
removing the photoresist in the TFT region;
removing a portion of the transition pattern of transparent conductive layer which is not covered by the photoresist by a wet etching process to form the pattern of second transparent conductive layer; and
removing the remaining photoresist.

In an example, an etching gas used in the dry etching process is a mixed gas of $SF_6$, $O_2$, and He, and a ratio of $SF_6$:$O_2$:He is 1:1:1.

In an example, an etching solution used in the wet etching process includes sulfuric acid of 8%-9% by weight percentage, acetic acid of 13%-15% by weight percentage, an additive of 1% by weight percentage, and water.

In an example, the manufacturing method further includes: providing a base substrate; and
forming a thin film transistor (TFT) and a pattern of first transparent conductive layer connected with a drain electrode of the TFT on the base substrate;
wherein the insulation layer covers the TFT and the pattern of first transparent conductive layer.

In an example, the second transparent conductive layer is made of indium tin oxide (ITO).

The embodiments of the present disclosure further provide a display substrate obtained by any manufacturing method as described above, the display substrate includes an insulation layer on a base substrate and a pattern of second transparent conductive layer on the insulation layer, the pattern of second transparent conductive layer includes a plurality of sub-electrodes arranged at intervals, the plurality of sub-electrodes are located in a display region of the display substrate; an orthographic projection of a portion of the insulation layer located in the display region on the base substrate coincides with an orthographic projection of the sub-electrodes on the base substrate.

In an example, the display substrate further includes:
a thin film transistor (TFT) located on the base substrate and a pattern of first transparent conductive layer connected with a drain electrode of the TFT;
wherein the insulation layer covers the TFT and the pattern of first transparent conductive layer connected with the drain electrode of the thin film transistor.

The embodiments of the present disclosure further provide a display device including any display substrate as described above.

In the manufacturing method of the display substrate provided by the embodiments of the present disclosure, a portion of the insulation layer which is located in the display region and is not covered by the pattern of second transparent conductive layer is removed, so that even if polycrystalline transparent conductive particles are left on the insulation layer after patterning the second transparent conductive layer, the polycrystalline transparent conductive particles would fall off from the display substrate as the portion of the insulation layer is removed, thereby avoiding polycrystalline transparent conductive particles remaining in the intervals of the pattern of second transparent conductive layer, avoiding a disorder of driving electric field in the display device, and improving a display performance of the display device. Moreover, an amount of transmitted backlight can also be increased by the removal of the portion of the insulation layer, thereby improving a transmittance of the display device.

BRIEF DESCRIPTION OF THE DRAWINGS

In order to allow those skilled in the art to clearly understand the present disclosure in a better way, the embodiments of the present disclosure will be described below in more details with reference to the accompanying drawings of the embodiments of the present disclosure. In the accompanying drawings.

DETAILED DESCRIPTION

Figure 1:
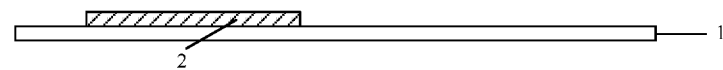
FIG. 1 is a schematic diagram of forming a gate electrode in a manufacturing method of a display substrate according to an embodiment of the present disclosure.

The technical solutions in the embodiments of the present disclosure will be clearly and completely described below in connection with the accompanying drawings in the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The embodiments of the present disclosure are directed to the following problems in the existing technology: the existing display substrate may have polycrystalline ITO particles remaining in the interval between slit electrodes, which not only may cause defects such as Mura due to a disorder of driving electric field in the display product but also may affect the transmittance of the display product. In order to solve the above problems, embodiments of the present disclosure provide a display substrate, a manufacturing method thereof and a display device which can remove residual polycrystalline ITO particles existed in the intervals of the slit electrode, and improve the display performance and the transmittance of the display device.

The embodiments of the present disclosure provide a manufacturing method of a display substrate, including: forming an insulation layer; forming a pattern of second transparent conductive layer on the insulation layer, the pattern of second transparent conductive layer including a plurality of sub-electrodes arranged at intervals, the plurality of sub-electrodes being located in a display region on the display substrate; and removing a portion of the insulation layer which is in the display region and is not covered by the sub-electrodes, forming a pattern of insulation layer.

In this embodiment, after forming the insulation layer, a portion of the insulation layer that is in the display region and is not covered by the pattern of second transparent conductive layer is removed, so that even if polycrystalline transparent conductive particles are left on the insulation layer after patterning the second transparent conductive layer, the polycrystalline transparent conductive particles would fall off from the display substrate as the portion of the insulation layer is removed, thereby avoiding polycrystalline transparent conductive particles remaining in the intervals of the pattern of second transparent conductive layer, avoiding a disorder of driving electric field in the display device, and improving the display performance of the display device.

Moreover, the amount of transmitted backlight can also be increased by the removal of the portion of the insulation layer, thereby improving the transmittance of the display device.

In an example, forming the pattern of second transparent conductive layer and forming the pattern of insulation layer may include:

forming a transition pattern of transparent conductive layer on the insulation layer, the transition pattern of transparent conductive layer including a first portion located in a thin film transistor (TFT) region of the display substrate and a second portion located in a display region of the display substrate, the second portion including the plurality of sub-electrodes arranged at intervals;

removing a portion of the insulation layer corresponding to the intervals between adjacent sub-electrodes in the display region; and removing the first portion of the transition pattern of transparent conductive layer, forming the pattern of second transparent conductive layer.

For example, the transition pattern of transparent conductive layer can be formed firstly. The transition pattern of transparent conductive layer includes a first portion in a TFT region and a second portion in a display region. Before patterning the insulation layer, it has to reserve the first portion of the transition pattern of transparent conductive layer in the TFT region because a portion of the insulation layer located in the TFT region needs to be reserved during patterning the insulation layer later. The portion of the insulation layer located in the TFT region can be protected by the reserved, first portion of the transition pattern of transparent conductive layer, during etching the insulation layer.

In an example, forming the pattern of second transparent conductive layer and forming the pattern of insulation layer may include:

depositing a second transparent conductive layer on the insulation layer;

coating a photoresist on the second transparent conductive layer, exposing and developing the photoresist to form a photoresist retained region and a photoresist removed region, the photoresist removed region corresponding to the intervals between adjacent sub-electrodes;

removing a portion of the second transparent conductive layer in the photoresist removed region by a wet etching process to form the transition pattern of transparent conductive layer;

removing a portion of the insulation layer in the photoresist removed region by a dry etching process;

removing the photoresist in the TFT region;

removing a portion of the transition pattern of transparent conductive layer which is not covered by the photoresist by a wet etching process to form the pattern of second transparent conductive layer; and removing the remaining photoresist.

In this embodiment, the transition pattern of transparent conductive layer is formed by wet etching. Wet etching does not affect the insulation layer. After the transition pattern of transparent conductive layer is formed, the portion of the insulation layer located in the photoresist removed region is removed by dry etching. When the portion of the insulation layer is removed, because the dry etching does not affect the second transparent conductive layer, the portion of the insulation layer located in the TFT region is protected by the portion of the second transparent conductive layer located in the TFT region, so that the portion of the insulation layer is not removed. Finally, the portion of the second transparent conductive layer located in the TFT region is removed by wet etching to form the pattern of second transparent conductive layer.

In this embodiment, the display substrate may be an array substrate of ADS mode, and the second transparent conductive layer may be a common electrode layer or a pixel electrode layer. When the pattern of second transparent conductive layer is a slit electrode, by removing a portion of the insulation layer corresponding to the intervals of the pattern of second transparent conductive layer, residue polycrystalline transparent conductive particles in the intervals of the pattern of second transparent conductive layer can be effectively removed, thereby avoiding a disorder of driving electric field of the display device, and improving the performance of the display device. Moreover, the amount of transmitted backlight can also be increased by the removal of the portion of the insulation layer, thereby improving the transmittance of the display device.

Hereinafter, the manufacturing method of the display substrate of the present embodiment will be described in detail with reference to the drawings, in which the pattern of second transparent conductive layer is a common electrode and the insulation layer is a passivation layer. As illustrated in FIG. 1 to FIG. 12, the manufacturing method of the display substrate of this embodiment may include the following steps.

Step 1, as illustrated in FIG. 1, providing a base substrate 1 and forming a pattern of gate electrode 2 on the substrate 1.

For example, the base substrate 1 may be a glass substrate or a quartz substrate. For example, a gate metal layer having a thickness of about 500 to 4,000 Å may be deposited on the base substrate 1 by sputtering or thermal evaporation, and the gate metal layer may be made of a metal such as Cu, Al, Ag, Mo, Cr, Nd, Ni, Mn, Ti, Ta, or W, or an alloy of these metals, the gate metal layer may have a single layer structure or a multilayer structure such as Cu\Mo, Ti\Cu\Ti, Mo\Al\Mo, and the like. A layer of photoresist is coated on the gate metal layer, and the photoresist is exposed with a mask to form a photoresist removed region and a photoresist retained region. The photoresist retained region corresponds to a region where a pattern of gate line and a pattern of gate electrode 2 are located, the photoresist removed region corresponds to a region other than the above-mentioned patterns; a developing process is performed so that the photoresist in the photoresist removed region is completely removed, and a thickness of the photoresist in the photoresist retained region remains unchanged. A portion of the gate metal layer in the photoresist removed region is completely etched away by an etching process. The remaining photoresist is stripped off to form the pattern of gate line (not illustrated) and the pattern of gate electrode 2.

Figure 2:
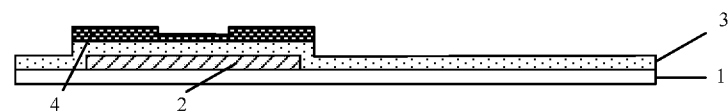
FIG. 2 is a schematic diagram of forming a gate insulation layer and an active layer in a manufacturing method of a display substrate according to an embodiment of the present disclosure.

Step 2, as illustrated in FIG. 2, forming a gate insulation layer 3 and an active layer 4 on the base substrate 1 obtained from the step 1.

For example, a gate insulation layer 3 having a thickness of 500 to 5,000 Å may be deposited on the base substrate 1 on which the step 1 has been completed by a plasma enhanced chemical vapor deposition (PECVD) method. The gate insulation layer 3 may be made of a material such as oxide, nitride and oxynitride, and the corresponding reaction gas may be $SiH_4$, $NH_3$, $N_2$, or $SiH_2Cl_2$, $NH_3$, $N_2$.

Depositing a layer of semiconductor material on the gate insulation layer 3; coating a layer of photoresist on the semiconductor material; exposing the photoresist to form a photoresist removed region and a photoresist completely retained region, the photoresist completely retained region corresponding to a region where the pattern of active layer 4 is located, and the photoresist removed region corresponding to a region other than the pattern of active layer 4; and performing a developing process so that the photoresist in the photoresist removed region is completely removed, and a thickness of the photoresist in the photoresist completely retained region remains unchanged; and completely etching away the semiconductor material in the photoresist removed region by an etching process to form the pattern of active layer 4.

Figure 3:
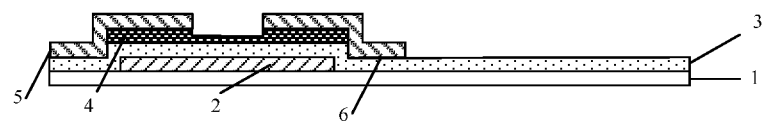
FIG. 3 is a schematic diagram of forming a source electrode and a drain electrode in a manufacturing method of a display substrate according to an embodiment of the present disclosure.

Step 3, as illustrated in FIG. 3, forming a source electrode 5 and a drain electrode 6 on the base substrate 1 obtained from the step 2.

For example, a source-drain metal layer having a thickness of about 2,000 to 4,000 Å may be deposited on the base substrate 1 obtained from the step 2 by magnetron sputtering, thermal evaporation or other film forming methods, and the source-drain metal layer may be of a metal such as Cu, Al, Ag, Mo, Cr, Nd, Ni, Mn, Ti, Ta and W, or an alloy of these metals. The source-drain metal layer may be a single layer structure or a multilayer structure such as Cu\Mo, Ti\Cu\Ti and Mo\Al\Mo. A layer of photoresist is coated on the gate metal layer, and the photoresist is exposed with a mask to form a photoresist removed region and a photoresist retained region. The photoresist retained region corresponds to a region where a pattern of source electrode 5, a pattern of drain electrode 6 and a pattern of data line are located, the photoresist removed region corresponds to a region other than the above-mentioned patterns; a developing process is performed so that the photoresist in the photoresist removed region is completely removed, and a thickness of the photoresist in the photoresist retained region remains unchanged. A portion of the source-drain metal layer in the photoresist removed region is completely etched away by an etching process. The remaining photoresist is stripped off to form the drain electrode 6, the source electrode 5 and the data line (not illustrated).

Figure 4:
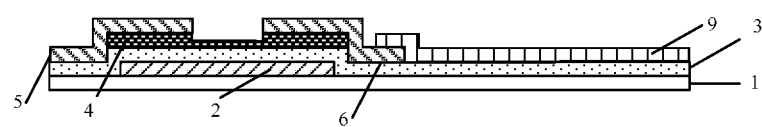
FIG. 4 is a schematic diagram of forming a pattern of first transparent conductive layer in a manufacturing method of a display substrate according to an embodiment of the present disclosure.

Step 4, as illustrated in FIG. 4, forming a pattern of first transparent conductive layer 9 on the base substrate 1 obtained from the step 3.

For example, depositing a first transparent conductive layer having a thickness of about 300 to 1,500 Å by sputtering or thermal evaporation on the base substrate 1 obtained from the step 3, in which the first transparent conductive layer may be of ITO, indium zinc oxide (IZO) or other transparent metal oxides; coating a layer of photoresist on the first transparent conductive layer; exposing the photoresist with a mask to form a photoresist removed region and a photoresist retained region, in which the photoresist retained region corresponds to a region where the pattern of first transparent conductive layer 9 (i.e., a pixel electrode) is located, and the photoresist removed region corresponds to a region other than the above-mentioned pattern; and performing a developing process so that the photoresist in the photoresist removed region is completely removed, and a thickness of the photoresist in the photoresist retained region remains unchanged; completely etching away the portion of the first transparent conductive layer located in the photoresist removed region by an etching process; stripping the remaining photoresist to form the pattern of first transparent conductive layer 9, the pattern of first transparent conductive layer 9 being directly connected to the drain electrode 6.

Figure 5:
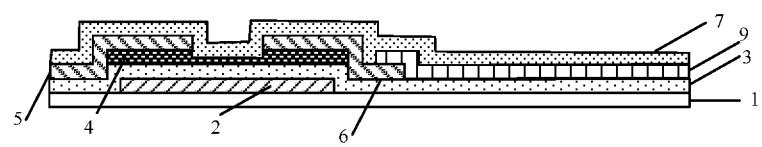
FIG. 5 is a schematic diagram of depositing a passivation layer material in a manufacturing method of a display substrate according to an embodiment of the present disclosure.

Step 5, as illustrated in FIG. 5, depositing a passivation layer material on the base substrate 1 obtained from the step 4;

For example, a passivation layer material having a thickness of 2,000 to 1,000 Å may be deposited on the base substrate 1 on which the step 4 is completed by magnetron sputtering, thermal evaporation, PECVD or other film forming methods, and the passivation layer material may be an oxide, a nitride or an oxynitride. For example, the passivation layer material may be $SiN_x$, $SiO_x$ or $Si(ON)_x$, and the passivation layer may also be made of $Al_2O_3$. The passivation layer may be a single layer structure or a bilayer structure composed of silicon nitride and silicon oxide. The reaction gas corresponding to the silicon oxide may be $SiH_4$, $N_2O$; the reaction gas corresponding to the nitride or the oxynitride may be $SiH_4$, $NH_3$, $N_2$, or may be $SiH_2Cl_2$, $NH_3$, $N_2$.

Figure 6:
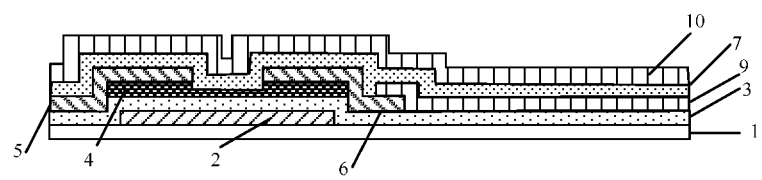
FIG. 6 is a schematic diagram of forming a second transparent conductive layer in a manufacturing method of a display substrate according to an embodiment of the present disclosure.

Step 6, as illustrated in FIG. 6, forming a second transparent conductive layer 10 on the passivation layer material.

For example, a second transparent conductive layer 10 having a thickness of about 300 to 1,500 Å is deposited on the passivation layer material by sputtering or thermal evaporation, and the second transparent conductive layer 10 may be composed of ITO, IZO or other transparent metal oxide.

Figure 7:
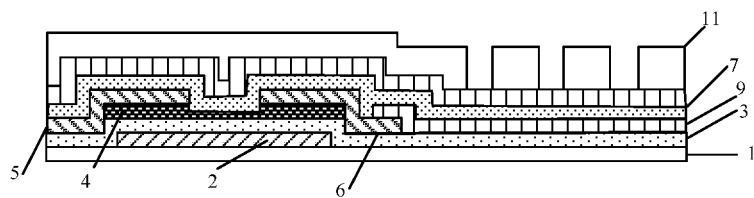
FIG. 7 is a schematic diagram of processing a second transparent conductive layer in a manufacturing method of a display substrate according to an embodiment of the present disclosure.

Step 7, as illustrated in FIG. 7, coating a photoresist 11 on the second transparent conductive layer 10, and exposing the photoresist 11 to form a photoresist retained region and a photoresist removed region, and the photoresist removed region corresponds to intervals between adjacent sub-electrodes of the pixel region to be formed.

Figure 8:
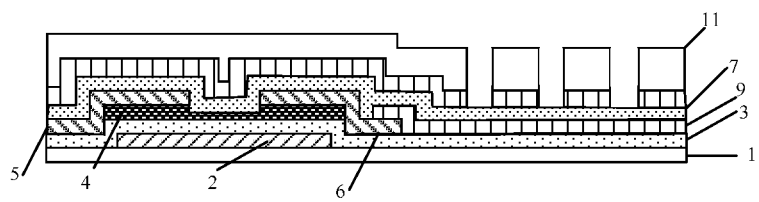
FIG. 8 is a schematic diagram of forming a transition pattern of transparent conductive layer in a manufacturing method of a display substrate according to an embodiment of the present disclosure.

Step 8, as illustrated in FIG. 8, removing a portion of the second transparent conductive layer 10 located in the photoresist removed region by a wet etching process, to form a transition pattern of transparent conductive layer.

For example, an etching solution used in the wet etching process includes sulfuric acid of 8%-9% by weight percentage, acetic acid of 13%-15% by weight percentage, an additive of 1% by weight percentage, and water. The transition pattern of transparent conductive layer includes a portion of the second transparent conductive layer 10 located in the TFT region and a pattern of sub-electrode located in the pixel region.

Figure 9:
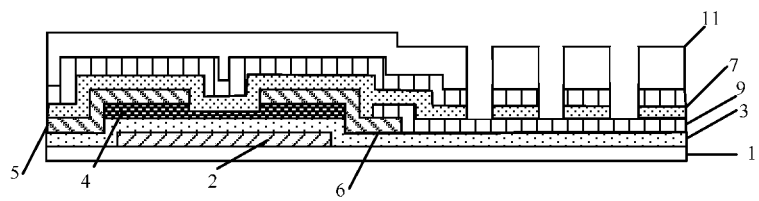
FIG. 9 is a schematic diagram of forming a pattern of passivation layer in a pixel region in a manufacturing method of a display substrate according to an embodiment of the present disclosure.

Step 9, as illustrated in FIG. 9, removing the passivation layer material located in the photoresist removed region by a dry etching process to form a pattern of passivation layer 7 in the pixel region.

For example, an etching gas used in the dry etching process is a mixed gas of $SF_6$, $O_2$, and He, and a ratio of $SF_6:O_2:He$ is 1:1:1. After the passivation layer material in the photoresist removed region is removed by dry etching, the transparent conductive particles left on the passivation layer material are also removed. It is worth noting that a pattern of passivation layer 8 located in the TFT region is always required to be reserved.

Figure 10:
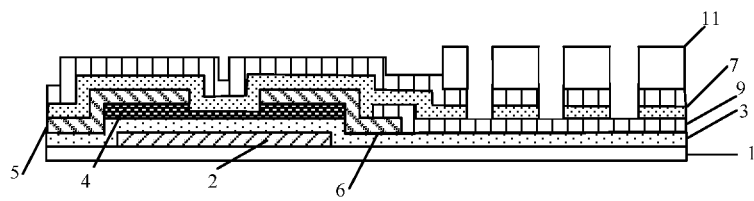
FIGS. 10-12 are schematic diagrams of forming a pattern of second transparent conductive layer in a manufacturing method of a display substrate according to an embodiment of the present disclosure.

Step 10, as illustrated in FIG. 10, removing the photoresist 11 in the TFT region.

Figure 11:
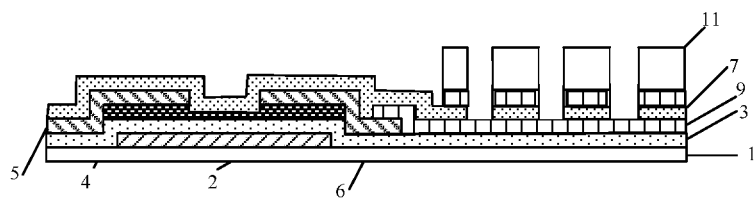

Step 11, as illustrated in FIG. 11, removing a portion of the transition pattern of transparent conductive layer which is not covered by the photoresist by a wet etching process to form a pattern of second transparent conductive layer 10, that is, a slit common electrode.

Figure 12:
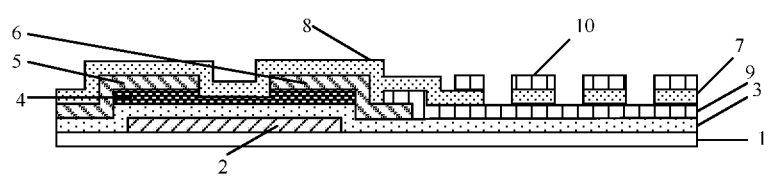

Step 12, as illustrated in FIG. 12, removing the remaining photoresist.

It can be seen that the passivation layer includes a pattern of passivation layer 8 located in the TFT region and a pattern of passivation layer 7 located in the pixel region. The pattern of passivation layer 8 in the TFT region is a complete and continuous planar structure, and the pattern of passivation layer 7 in the pixel region corresponds to the pattern of second transparent conductive layer 10.

The array substrate of ADS mode in the present embodiment can be formed through the above steps 1-12.

Figure 13:
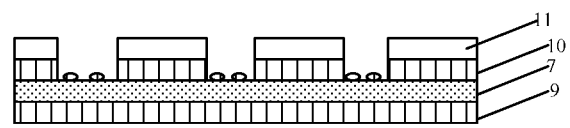
FIGS. 13-15 are schematic diagrams of etching a passivation layer in a manufacturing method of a display substrate according to an embodiment of the present disclosure.
Figure 14:
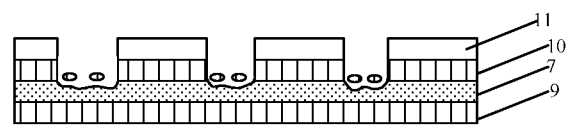
Figure 15:
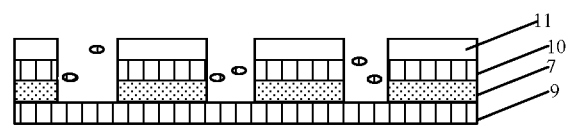

As illustrated in FIG. 13, when the slit common electrode is formed, polycrystalline transparent conductive particles may be left between the slits (intervals) of the slit common electrode. As illustrated in FIG. 14 and FIG. 15, by removing the portion of the passivation layer corresponding to the slits (intervals) of the slit common electrode, the polycrystalline transparent conductive particles left in the slits (intervals) of the slit common electrode can be effectively removed, thereby avoiding a disorder of driving electric field of the display device and improving the display performance of the display device. Moreover, the amount of transmitted backlight can also be increased by the removal of the portion of the insulation layer, thereby improving the transmittance of the display device.

An embodiment of the present disclosure further provides a display substrate obtained by the manufacturing method of any of the above embodiments. The display substrate includes: an insulation layer located on a base substrate and a pattern of second transparent conductive layer located on the insulation layer, the pattern of second transparent conductive layer including a plurality of sub-electrodes arranged at intervals, and the plurality of sub-electrodes being located in a display region; an orthographic projection of a portion of the insulation layer located in the display region on the base substrate coincides with an orthographic projection of the plurality of sub-electrodes on the base substrate.

In this embodiment, a portion of the insulation layer that is located in the display region of the display substrate and not covered by the pattern of second transparent conductive layer is removed, so that even if polycrystalline transparent conductive particles left on the insulation layer after patterning the second transparent conductive layer, the particles would fall off from the display substrate as the portion of the insulation layer is removed, thereby avoiding polycrystalline transparent conductive particles to be left in the slits (intervals) of the pattern of second transparent conductive layer, and hence avoiding the disorder of driving electric field in the display device, and improving the display performance of the display device. Moreover, the amount of transmitted backlight can also be increased by the removal of the portion of the insulation layer, thereby improving the transmittance of the display device.

For example, the display substrate may be an array substrate of ADS mode, the pattern of second transparent conductive layer may be a common electrode, the insulation layer may be a passivation layer, and the display substrate may further include: a thin film transistor (TFT) located on the base substrate, and a pattern of first transparent conductive layer connected with a drain electrode of the TFT; wherein the insulation layer covers the TFT and the pattern of first transparent conductive layer connected with the drain electrode of the TFT.

The pattern of first transparent conductive layer may be a pixel electrode. When the pattern of second transparent conductive layer is a slit electrode, by removing a portion of the insulation layer corresponding to the intervals of the pattern of second transparent conductive layer, the polycrystalline transparent conductive particles left in the intervals of the pattern of second transparent conductive layer can be effectively removed, thereby avoiding the disorder of driving electric field in the display device, and improving the display performance of the display device. Moreover, the amount of transmitted backlight can also be increased by the removal of the portion of the passivation layer so as to improve the transmittance of the display device.

Embodiments of the present disclosure further provide a display device including the display substrate of any of the foregoing embodiments. The display device may be any product or component having a display function, such as a liquid crystal television, a liquid crystal display, a digital photo frame, a mobile phone and a tablet computer. The display device further includes a flexible circuit board, a printed circuit board, and a backboard.

In the display device provided by the embodiments of the present disclosure, transparent conductive particles will not be left in the intervals of the slit electrode, which can avoid the disorder of driving electric field in the display device, improve the display performance of the display device, and also can increase; moreover, the amount of transmitted backlight can be increased by the removal of the portion of the insulation layer in the display region not covered by the slit electrode, so as to improve the transmittance of the display device.

In various embodiments of the method in the present disclosure, the sequence numbers of the steps are not intended to be used to limit the sequence of the steps. For those skilled in the art, changing the sequence of various steps can be obtained without any creative work and also falls within the protection scope of the present disclosure.

It should be appreciated that, when an element such as a layer, a film, a region or a substrate is referred to be "on" or "below" another element, this element may be "directly" "on" or "below" another element, or an intermediate element may be present.

The above are only specific implementations of the present disclosure. It should be noted that, for those skilled in the art, any changes or substitutions, obtained without departing from the principles of the present disclosure, should be covered by the protection scope of the present disclosure.

The application claims priority to the Chinese patent application No. 201710137831.7, filed on Mar. 9, 2017, the entire disclosure of which is incorporated herein by reference as part of the present application.

What is claimed is:

1. A manufacturing method of a display substrate, comprising:
    providing a base substrate;
    forming a thin film transistor (TFT), a gate line, and a pattern of first transparent conductive layer directly connected with a drain electrode of the TFT on the base substrate, comprising: removing the remaining material of film layers for forming the TFT, the gate line, and the pattern of first transparent conductive layer by an etching process,
    forming an insulation layer, the insulation layer covering the pattern of TFT and the pattern of first transparent conductive layer;
    forming a pattern of second transparent conductive layer on the insulation layer, the pattern of second transparent conductive layer comprising a plurality of sub-electrodes arranged at intervals, the plurality of sub-electrodes being located in a display region of the display substrate; and
    removing a portion of the insulation layer which is in the display region and not covered by the plurality of sub-electrodes and forming a pattern of insulation layer.

2. The manufacturing method of the display substrate according to claim 1, wherein forming the pattern of second transparent conductive layer and forming the pattern of insulation layer comprise:
   forming a transition pattern of transparent conductive layer on the insulation layer, the transition pattern of transparent conductive layer comprising a first portion located in a thin film transistor (TFT) region of the display substrate and a second portion located in the display region, the second portion comprising the plurality of sub-electrodes arranged at intervals;
   removing a portion of the insulation layer corresponding to intervals between adjacent sub-electrodes in the display region; and
   removing the first portion of the transition pattern of transparent conductive layer and forming the pattern of second transparent conductive layer.

3. The manufacturing method of the display substrate according to claim 2, wherein forming the pattern of second transparent conductive layer and forming the pattern of insulation layer further comprise:
   depositing a second transparent conductive layer on the insulation layer;
   coating a photoresist on the second transparent conductive layer, exposing and developing the photoresist to form a photoresist retained region and a photoresist removed region, the photoresist removed region corresponding to the intervals between adjacent sub-electrodes;
   removing a portion of the second transparent conductive layer in the photoresist removed region by a wet etching process to form the transition pattern of transparent conductive layer;
   removing a portion of the insulation layer in the photoresist removed region by a dry etching process;
   removing the photoresist in the TFT region;
   removing a portion of the transition pattern of transparent conductive layer not covered by the photoresist by a wet etching process to form the pattern of second transparent conductive layer; and
   removing the remaining photoresist.

4. The manufacturing method of the display substrate according to claim 3, wherein an etching gas used in the dry etching process is a mixed gas of $SF_6$, $O_2$, and He, and a ratio of $SF_6$:$O_2$:He is 1:1:1.

5. The manufacturing method of the display substrate according to claim 3, wherein an etching solution used in the wet etching process comprises sulfuric acid of 8%-9% by weight percentage, acetic acid of 13%-15% by weight percentage, an additive of 1% by weight percentage, and water.

6. The manufacturing method of the display substrate according to claim 1, wherein the second transparent conductive layer is made of indium tin oxide (ITO).

* * * * *